(12) United States Patent
Miki

(10) Patent No.: US 9,633,978 B2
(45) Date of Patent: Apr. 25, 2017

(54) SEMICONDUCTOR DEVICE AND METHOD OF MANUFACTURING THE SAME

(71) Applicant: SHINKO ELECTRIC INDUSTRIES CO., LTD., Nagano-shi (JP)

(72) Inventor: Shota Miki, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/567,056

(22) Filed: Dec. 11, 2014

(65) Prior Publication Data

US 2015/0228624 A1 Aug. 13, 2015

(30) Foreign Application Priority Data

Feb. 12, 2014 (JP) ................. 2014-024242

(51) Int. Cl.
*H01L 25/065* (2006.01)
*H01L 25/00* (2006.01)
(Continued)

(52) U.S. Cl.
CPC ........ *H01L 25/0657* (2013.01); *H01L 21/563* (2013.01); *H01L 25/50* (2013.01); *H05K 3/368* (2013.01); *H01L 23/3121* (2013.01); *H01L 23/367* (2013.01); *H01L 24/13* (2013.01); *H01L 24/16* (2013.01); *H01L 24/17* (2013.01); *H01L 24/32* (2013.01); *H01L 24/73* (2013.01); *H01L 24/75* (2013.01); *H01L 24/81* (2013.01); *H01L 24/83* (2013.01); *H01L 24/92* (2013.01); *H01L 2224/0401* (2013.01); *H01L 2224/13022* (2013.01); *H01L 2224/13024* (2013.01); *H01L 2224/13025* (2013.01); *H01L 2224/13082* (2013.01); *H01L 2224/14181* (2013.01); *H01L 2224/16146* (2013.01);
(Continued)

(58) Field of Classification Search
USPC .......................................... 257/778; 438/108
See application file for complete search history.

(56) References Cited

U.S. PATENT DOCUMENTS

2002/0079590 A1* 6/2002 Nakaoka ............... H01L 21/561
257/777
2012/0193779 A1* 8/2012 Lee ..................... H01L 23/3135
257/737

(Continued)

FOREIGN PATENT DOCUMENTS

JP 2013-55313 A1 3/2013

*Primary Examiner* — Zandra Smith
*Assistant Examiner* — Lawrence Tynes, Jr.
(74) *Attorney, Agent, or Firm* — Kratz, Quintos & Hanson, LLP

(57) ABSTRACT

A semiconductor device includes a wiring substrate, a first semiconductor chip flip-chip connected to the wiring substrate, a first underfill resin filled between the wiring substrate and the first semiconductor chip, the first underfill resin including a pedestal portion arranged in a periphery of the first semiconductor chip, a second semiconductor chip flip-chip connected to the first semiconductor chip, and being larger in area than the first semiconductor chip, and a second underfill resin filled between the first semiconductor chip and the second semiconductor chip, the second underfill resin covering an upper face of the pedestal portion of the first underfill resin and a side face of the second semiconductor chip.

20 Claims, 20 Drawing Sheets

(51) Int. Cl.
    *H05K 3/36*         (2006.01)
    *H01L 21/56*       (2006.01)
    *H01L 23/31*       (2006.01)
    *H01L 23/18*       (2006.01)
    *H05K 3/34*        (2006.01)
    *H01L 23/367*      (2006.01)
    *H01L 23/00*       (2006.01)

(52) U.S. Cl.
    CPC ............ *H01L 2224/16148* (2013.01); *H01L 2224/16235* (2013.01); *H01L 2224/16238* (2013.01); *H01L 2224/17181* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/75743* (2013.01); *H01L 2224/81005* (2013.01); *H01L 2224/81191* (2013.01); *H01L 2224/81193* (2013.01); *H01L 2224/81815* (2013.01); *H01L 2224/83191* (2013.01); *H01L 2224/83192* (2013.01); *H01L 2224/92125* (2013.01); *H01L 2225/06513* (2013.01); *H01L 2225/06517* (2013.01); *H01L 2225/06541* (2013.01); *H01L 2225/06589* (2013.01); *H01L 2924/10253* (2013.01); *H01L 2924/1432* (2013.01); *H01L 2924/157* (2013.01); *H01L 2924/15311* (2013.01); *H05K 3/3436* (2013.01); *H05K 2201/041* (2013.01); *H05K 2201/10977* (2013.01)

(56) References Cited

U.S. PATENT DOCUMENTS

| | | | |
|---|---|---|---|
| 2013/0037943 A1 | 2/2013 | Yamano | |
| 2013/0137216 A1* | 5/2013 | Ito | H01L 25/0652 438/108 |
| 2013/0137217 A1* | 5/2013 | Kindo | H01L 21/50 438/109 |

\* cited by examiner

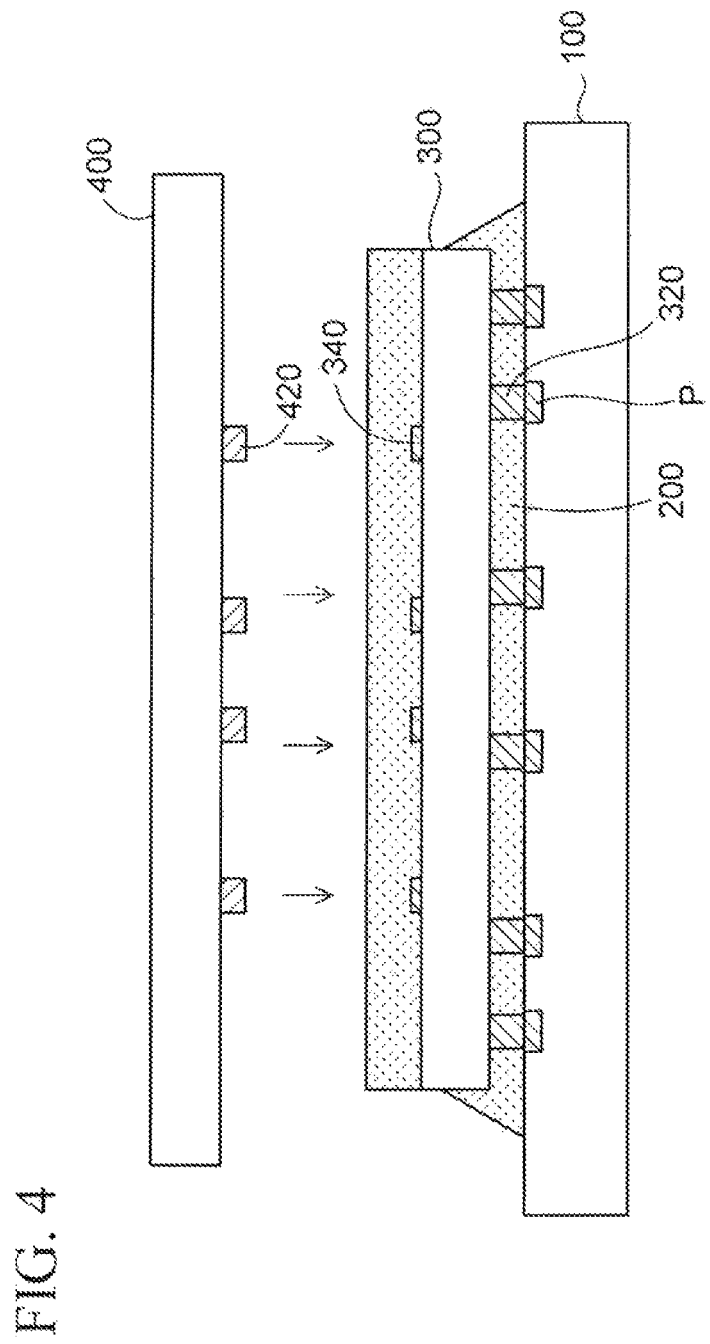

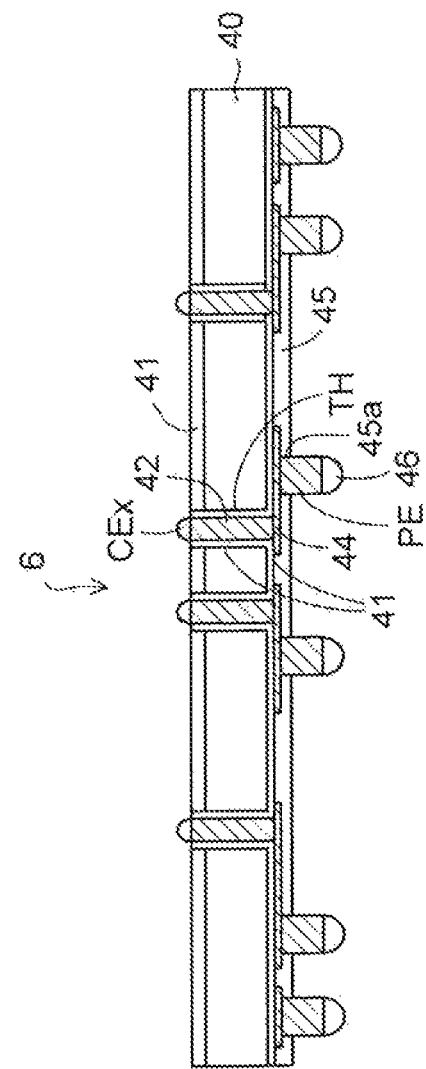

SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2014-024242, filed on Feb. 12, 2014, the entire contents of which are incorporated herein by reference.

FIELD

This invention is related to a semiconductor device and a method of manufacturing the same.

BACKGROUND ART

In the prior art, there is a semiconductor device in which a semiconductor chip is flip-chip connected on a wiring substrate. In such semiconductor device, in order to attain the further higher density of the mounting, a technique is developed in which a first semiconductor chip is flip-chip connected on the wiring substrate, then a second semiconductor chip is flip-chip connected on the first semiconductor chip and they are stacked.

A related art is disclosed in Japanese Laid-open Patent Publication No. 2013-55313.

SUMMARY

As will be explained in the section of preliminary matter given below, there is a semiconductor device in which a first semiconductor chip and a second semiconductor chip are flip-chip connected in this order on a wiring substrate, and a underfill resin is filled between them.

In such semiconductor device, there is a problem that in the case that the area of the second semiconductor chip located to the upper side is larger than the area of the first semiconductor chip located to the lower side, it is difficult to cover a side face of the second semiconductor chip with the underfill resin, and high reliability cannot be obtained.

According to one aspect discussed herein, there is provided a semiconductor device, including a wiring substrate, a first semiconductor chip flip-chip connected on the wiring substrate, a first underfill resin filled between the wiring substrate and the first semiconductor chip, the first underfill resin including a pedestal portion arranged in a periphery of the first semiconductor chip, a second semiconductor chip flip-chip connected on the first semiconductor chip, and being larger in area than the first semiconductor chip, and a second underfill resin filled between the first semiconductor chip and the second semiconductor chip, the second underfill resin covering an upper face of the pedestal portion of the first underfill resin and a side face of the second semiconductor chip.

Also, according to another aspect discussed herein, there is provided a method of manufacturing a semiconductor device, including forming a first sealing resin material on a wiring substrate, pushing an electrode of a first semiconductor chip into the first sealing resin material to flip-chip connect the first semiconductor chip to the wiring substrate, and filling a first underfill resin between the wiring substrate and the first semiconductor chip, and forming a pedestal portion from the first underfill resin in a periphery of the first semiconductor chip, forming a second sealing resin material on the first semiconductor chip, and pushing an electrode of a second semiconductor chip into the second sealing resin material to flip-chip connect the second semiconductor chip to the first semiconductor chip, and filling a second underfill resin between the first semiconductor chip and the second semiconductor chip, and covering an upper face of the pedestal portion of the first underfill resin and a side face of the second semiconductor chip with the second underfill resin.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a cross-sectional view depicting the method of manufacturing a semiconductor device according to the preliminary matter (part 4).

FIG. 9 is a cross-sectional view depicting the Method of manufacturing a semiconductor device of the Embodiment (part 4).

DESCRIPTIONS OF EMBODIMENTS

Hereinbelow, an embodiment will be explained with reference to the accompanying drawings.

Prior to the explanation of the embodiment, the preliminary matter to be set forth as a basis will be explained hereunder.

Figure 1A:
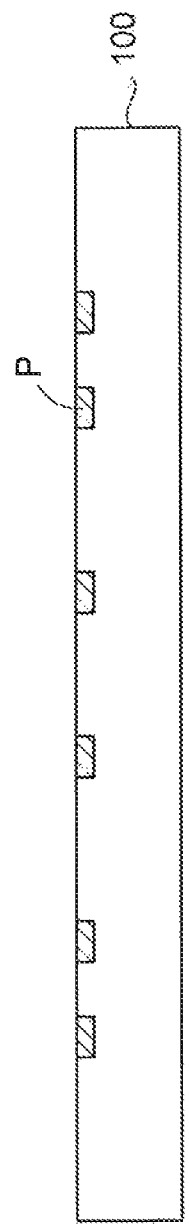
FIGS. 1A and 1B are cross-sectional views depicting a method of manufacturing a semiconductor device according to a preliminary matter (part 1).

In a method of manufacturing a semiconductor device according to the preliminary matter, as depicted in FIG. 1A, first, a wiring substrate 100 including connection pads P in an upper face thereof is prepared.

Figure 1B:
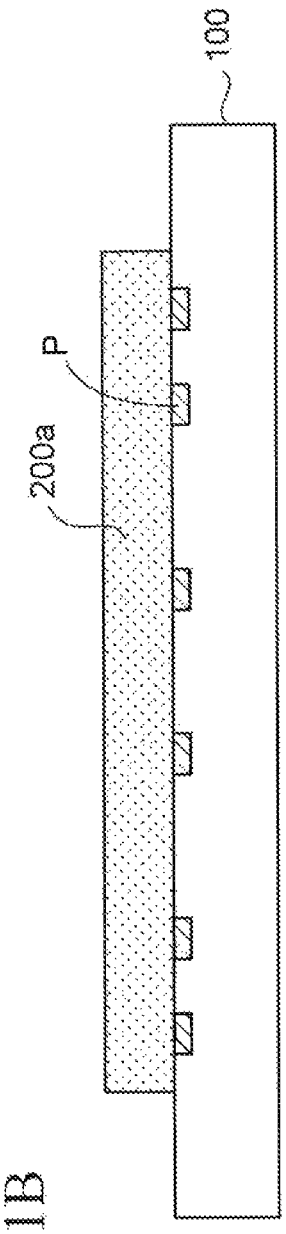

Then, as depicted in FIG. 1B, an uncured sealing resin material 200a for the prior sealing is formed on the wiring substrate 100. Further, as depicted in FIG. 2, a first semiconductor chip 300 is prepared.

The first semiconductor chip 300 includes bump electrodes 320 on an element forming face side thereof and connection electrodes 340 on a back face side thereof. The bump electrodes 320 and the connection electrodes 340 of the first semiconductor chip 300 are connected by penetrating electrodes which are not depicted.

Figure 2:
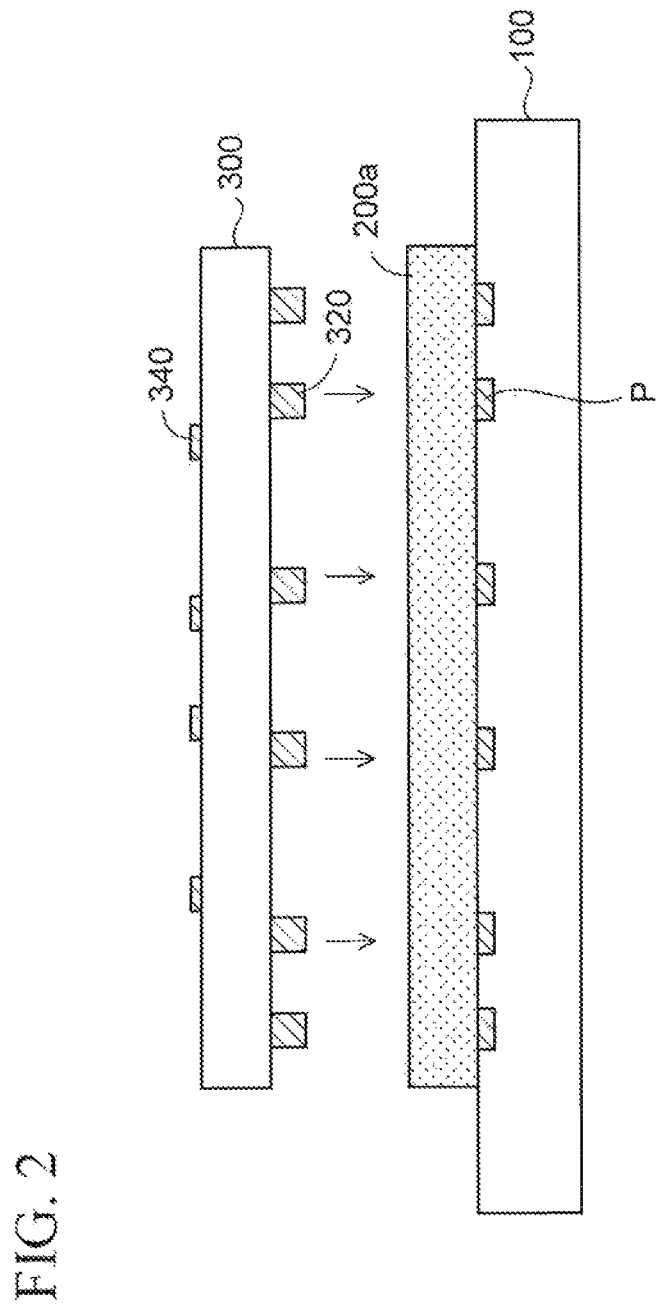
FIG. 2 is a cross-sectional view depicting the method of manufacturing a semiconductor device according to the preliminary matter (part 2).
Figure 3A:
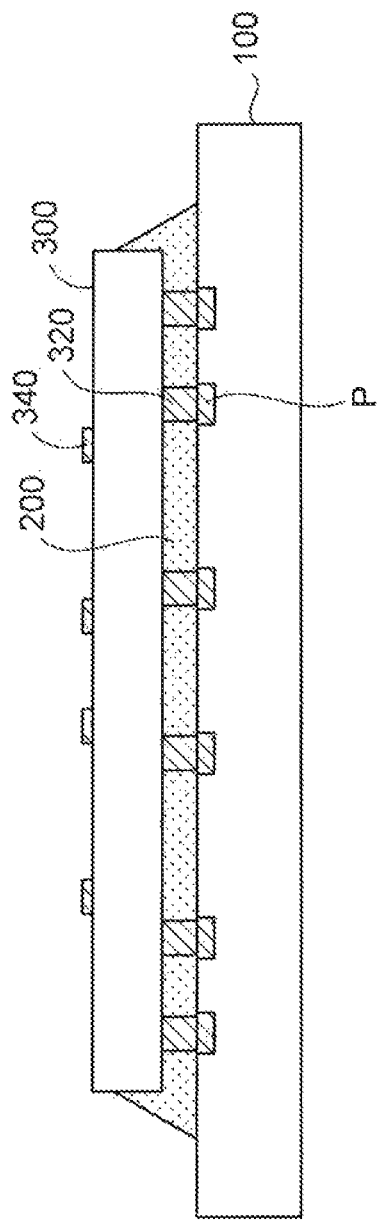
FIGS. 3A and 3B are cross-sectional view depicting the method of manufacturing a semiconductor device according to the preliminary matter (part 3).

Then, referring to FIG. 3A in addition to FIG. 2, the bump electrodes 320 of the first semiconductor chip 300 are pushed into the sealing resin material 200a, and are pressure-welded onto the connection pads P of the wiring substrate 100.

Furthermore, a heat process is performed re reflow solder (not depicted) at tips of the bump electrodes 320 of the first semiconductor chip 300, thereby the bump electrodes 320 of the first semiconductor chip 300 are flip-chip connected to the connection pads P of the wiring substrate 100.

By this matter, an underfill resin 200 formed from the sealing resin material 200a is filled between the first semiconductor chip 300 and the wiring substrate 100. The underfill resin 200 is formed to cover a side face of the first semiconductor chip 300.

Figure 3B:
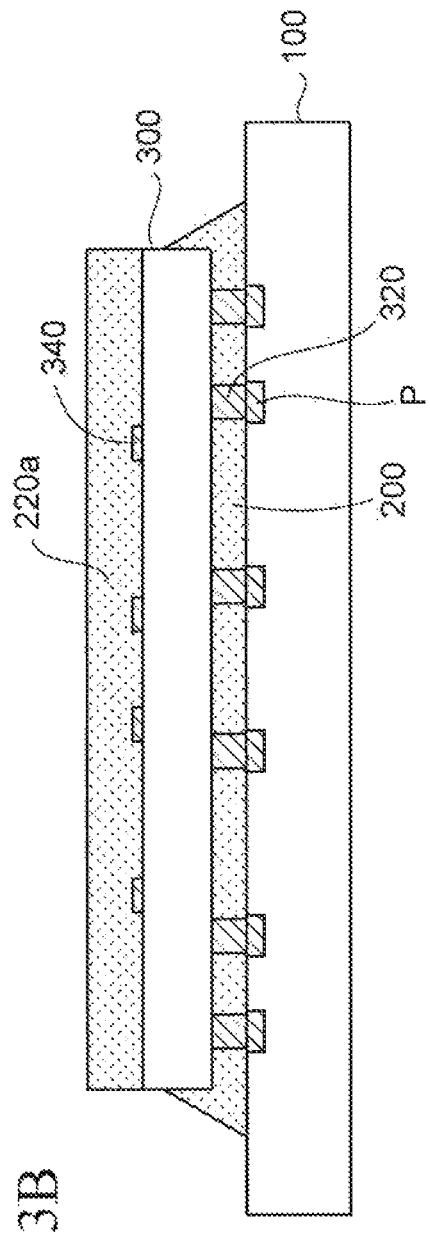

Further, as depicted in FIG. 3B, a sealing resin material 220a is formed on the first semiconductor chip 300. Subsequently, as depicted in FIG. 4, a second semiconductor chip 400 including bump electrodes 420 on an element forcing face side thereof is prepared. The area of the second semiconductor chip 400 is set one size larger than the area of the first semiconductor chip 300.

Figure 5:
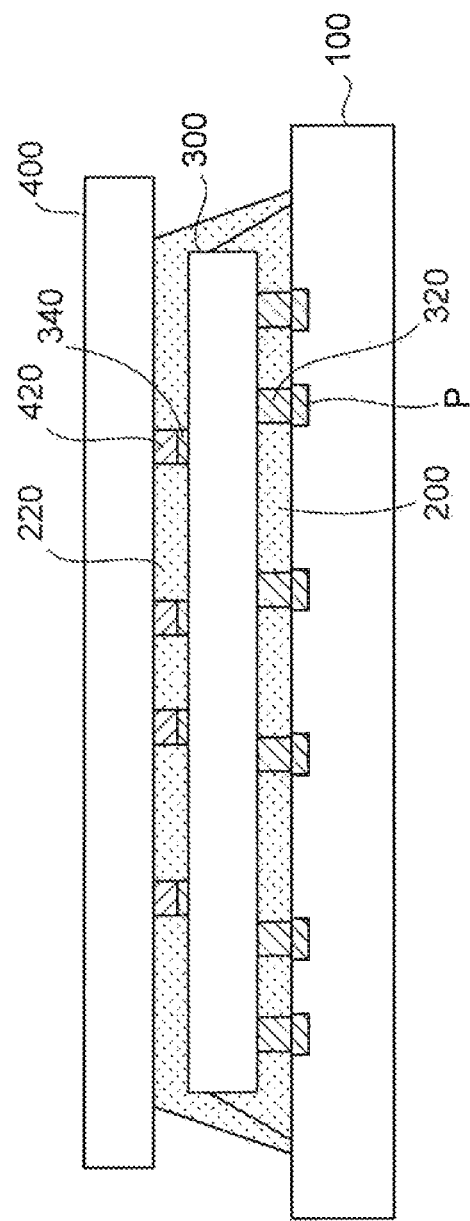
FIG. 5 is a cross-sectional view depicting the method of manufacturing a semiconductor device according to the preliminary matter (part 5).

Then, referring to FIG. 5 in addition to FIG. 4, the bump electrodes 420 of the second semiconductor chip 400 are pushed into the sealing resin material 220a, and are pressure-welded onto the connection electrodes 340 of the first semiconductor chip 300.

Further, a heat process is performed to reflow solder (not depicted) at tips of the bump electrodes 420 of the second semiconductor chip 400, thereby the bump electrodes 420 of the second semiconductor chip 400 are flip-chip connected to the connection electrodes 340 of the first semiconductor chip 300.

By this matter, an underfill resin 220 formed from the sealing resin material 220a is filled between the second semiconductor chip 400 and the first semiconductor chip 300 and between the second semiconductor chip 400 and the wiring substrata 100.

At this time, as depicted in FIG. 5, the area of the second semiconductor chip 400 is set larger than the area of the first semiconductor chip 300. Therefore, it is in a state that the sealing resin material 220a on the first semiconductor chip 300 cannot flow to a side face of the second semiconductor chip 400 and stays on a lower face of the second semiconductor chip 400.

Accordingly, it is in a state that the whole of the side face of the second semiconductor chip 400 is exposed to ambient air. In addition, it is in a state that an outer periphery part of the element forming face of the second semiconductor chip 400 is exposed to ambient air as well. For this reason, in the semiconductor device having the structure in FIG. 5, moisture enters an inside from a side face of an element forming region of the second semiconductor chip 400, thus the characteristic deterioration and the failure or the like are caused easily, and the reliability cannot be ensured.

In a semiconductor device of an embodiment which is explained below, even when the area of the second semiconductor chip located to the upper side is larger than the area of the first semiconductor chip located to the lower side, the side face of the second semiconductor chip can be certainly coated with the underfill resin, thus the reliability can be ensured.

Embodiment

Figure 19:
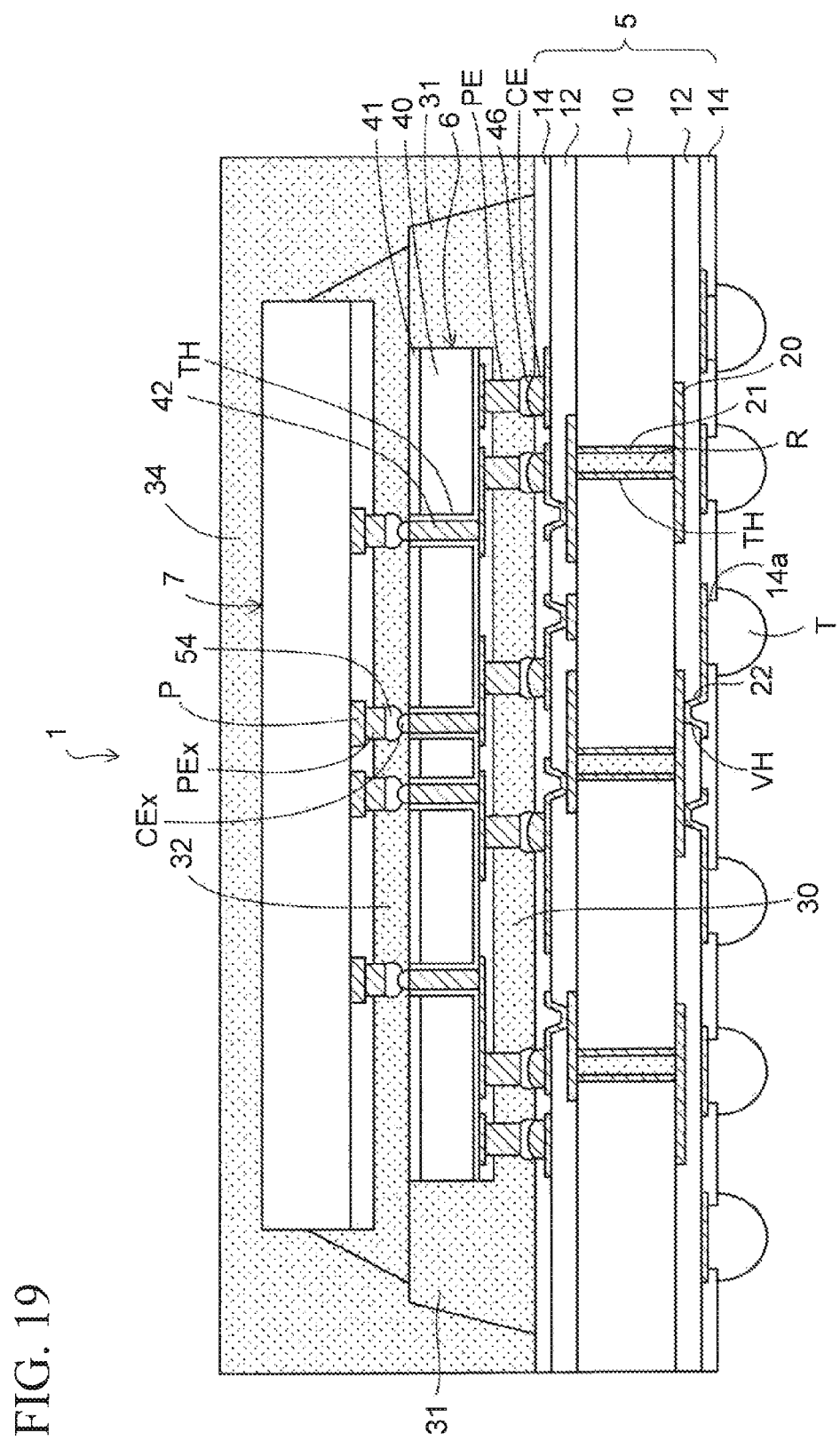
FIG. 19 is a cross-sectional view depicting a semiconductor device of the embodiment (part 1).
Figure 20:
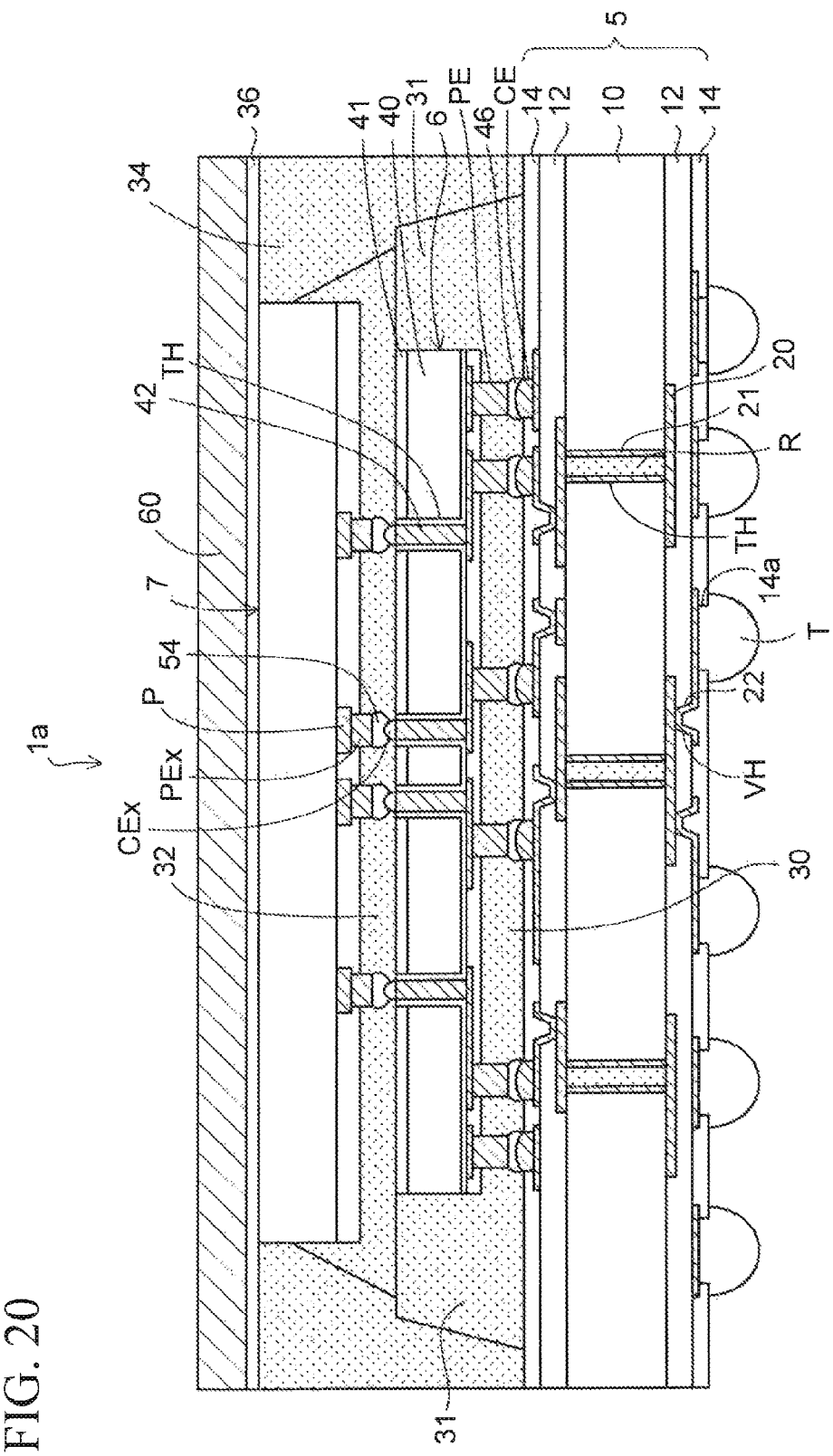
FIG. 20 is a cross-sectional view depicting a semiconductor device of the embodiment (part 2).

FIG. 6 to FIG. 18 are views depicting a method of manufacturing a semiconductor device of the embodiment. FIG. 19 and FIG. 20 are views each depicting a semiconductor device of the embodiment. Hereinbelow, while explaining the method of manufacturing a semiconductor device, the structure of the semiconductor device will be explained.

Figure 6:
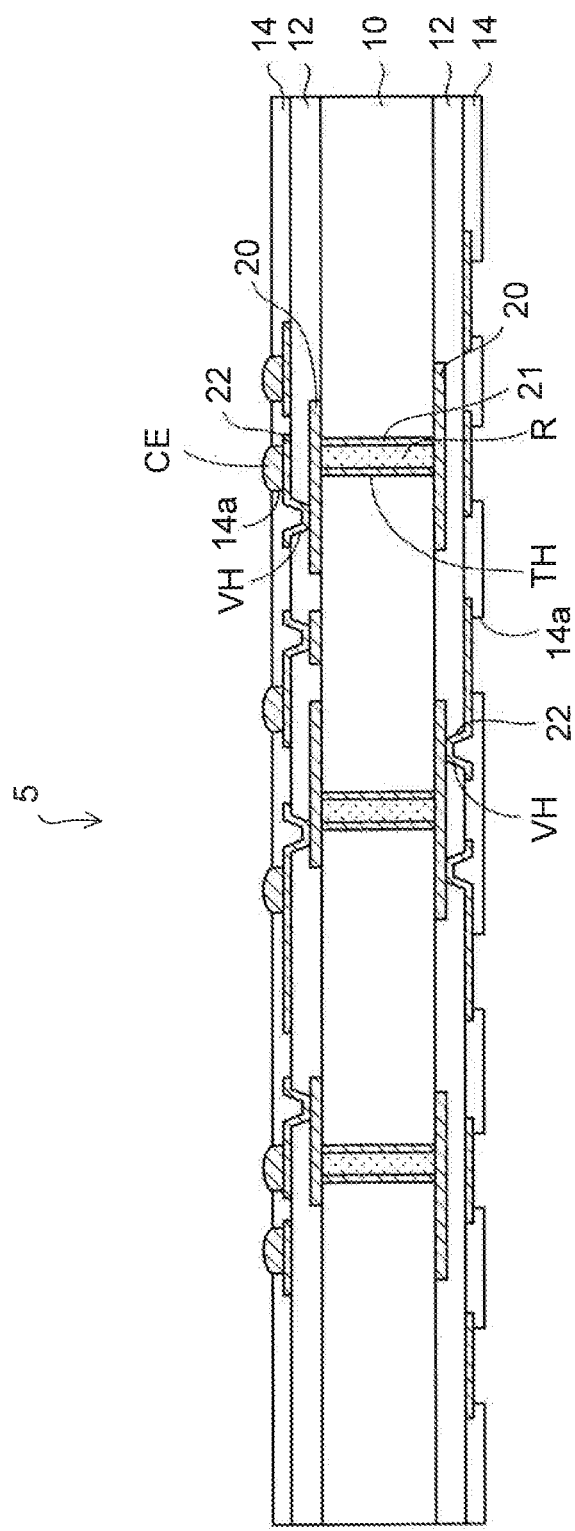
FIG. 6 is a cross-sectional view depicting a method of manufacturing a semiconductor device of an embodiment (part 1).

In the method of manufacturing a semiconductor device of the embodiment, first, a wiring substrate 5 as depicted in FIG. 6 is prepared. The wiring substrate 5 includes a core substrate 10 in a center part of the thickness direction. The core substrate 10 is formed of an insulating material which is a glass epoxy resin or the like.

First wiring layers 20 made of copper or a copper alloy are formed on both face sides of the core substrate 10 respectively. Through-holes TH penetrating in the thickness direction are formed in the core substrate 10. Through-hole plating layers 21 are formed on inner walls of the through-holes TH, and resin bodies R are filled in the remaining hole of the through-holes TH. Alternatively, a structure may be employed in which penetrating electrodes are filled in the whole of the through-holes TH of the core substrate 10.

The first wiring layers 20 on both face sides of the core substrate 10 are connected each other through the through-hole plating layers 21. An interlayer insulating layer 12 is formed on both face sides of the core substrate 10 respectively, the interlayer insulating layer 12 in which via holes VH are arranged on the connection parts of the first wiring layers 20. The interlayer insulating layer 12 is formed of an insulating resin which is an epoxy resin, a polyimide resin, or the like.

Moreover, second wiring layers 22 are formed on the interlayer insulating layers 12 on both face sides and connected to the first wiring layers 20 through the via holes VH respectively. The second wiring layers 22 are formed of copper or a copper alloy.

Further, a solder resist layer 14 is formed on the interlayer insulating layers 12 on both face sides respectively, the solder resist layer 14 in which opening portions 14a are arranged on the connection parts of the second wiring layers 22. The solder resist layer 14 is formed of an insulating resin which is a polyimide resin, an acrylic resin, or the like.

Then, connection electrodes CE which are formed of a nickel/gold plating layer, a solder layer, or the like are formed on the connection parts of the second wiring layers 22 on the upper face side of the core substrate 10.

Then, a heat process is performed to the wiring substrate 5 at a temperature of about 125° C., thereby the moisture is evaporated and the wiring substrate 5 is dried. Further, by processing an upper face of the wiring substrate 5 by argon plasma, its wettability is improved. By this matter, the pretreatment for forming a sealing resin for the prior sealing is completed.

Figure 7:
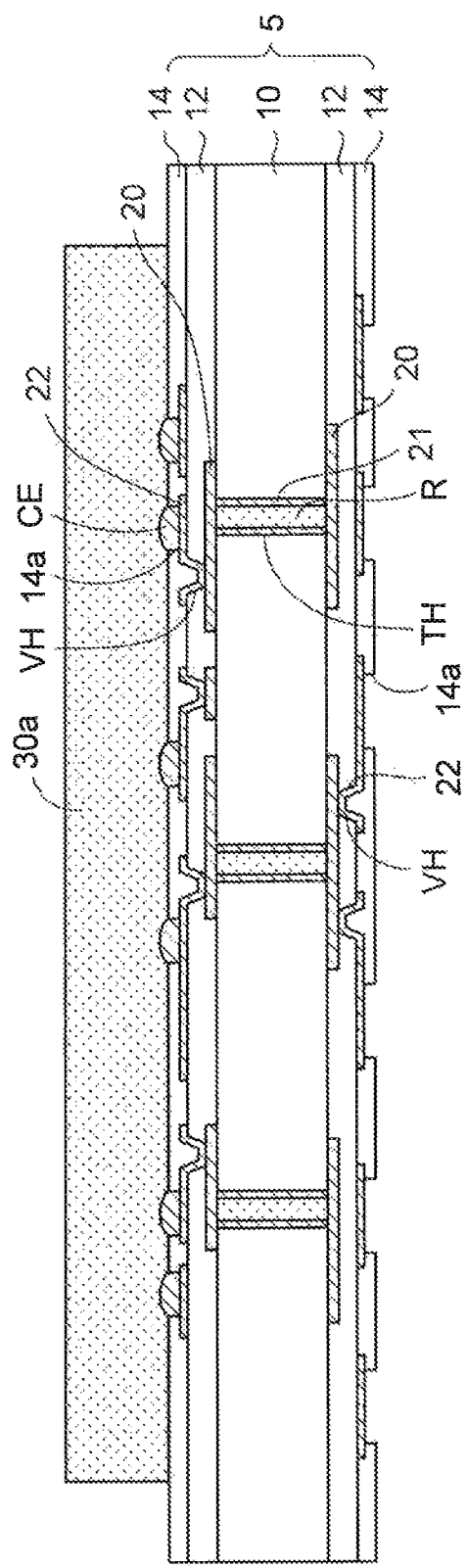
FIG. 7 is a cross-sectional view depicting the Method of manufacturing a semiconductor device of the Embodiment (part 2).

Then, as depicted in FIG. 7, a first sealing resin material 30a for the prior sealing is formed on the wiring substrate 5. As one preferred example of the first sealing resin material 30a, an epoxy-based resin having a lowest melt viscosity of 300 Pa·s, or an acryl-based resin having a lowest melt viscosity of 20 Pa·s to 30 Pa·s is used.

Figure 8A:
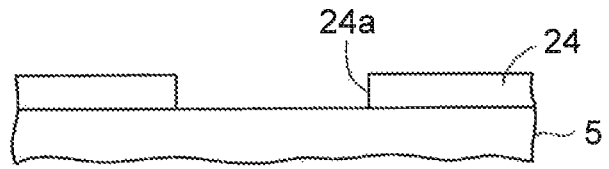
FIGS. 8A and 8D are cross-sectional views and a plan View depicting the method of manufacturing a semiconductor Device of the embodiment (part 3).

A plurality of chip mounting regions are defined in the wiring substrate 5. In FIG. 7, one chip mounting region is depicted. As a specific example of forming the first sealing resin material 30a on the wiring substrate 5, first, as depicted in FIG. 8A, a masking tape 24 is attached on the wiring substrate 5, the masking tape 24 in which opening portions 24a are provided on the respective chip mounting regions of the wiring substrate 5.

Figure 8B:
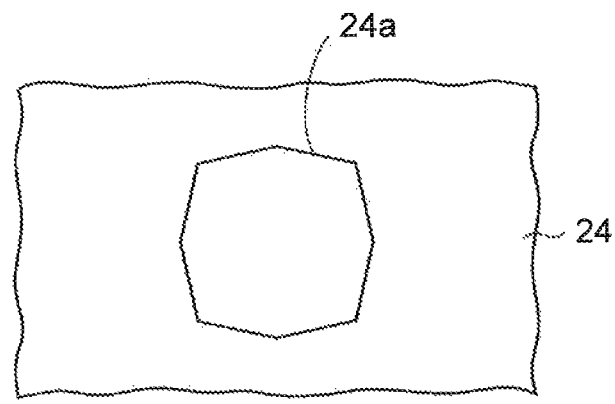

As depicted in a plan view of FIG. 8B, the opening portions 24a of the masking tape 24 are forced with an octagonal shape in which a center of each side in a quadrangle shape extends outward.

Figure 8C:
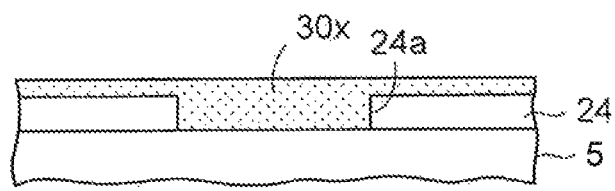
Figure 8D:
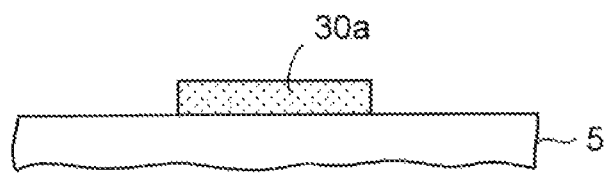

Thereafter, as depicted in FIG. 8C, an uncured resin sheet 30z is attached to be pressed on the wiring substrate 5 to which the masking tape 24 is attached. Further, as depicted in FIG. 8D, the masking tape 24 is detached from the wiring substrate 5.

By this matter, the part of the resin sheet 30x arranged on the masking tape 24 is removed simultaneously with the masking tape 24. As a result, the parts of the resin sheet 30z arranged in the plurality of opening portions 24a of the masking tape 24 are left on the wiring substrate 5 as the first sealing resin materials 30a.

In this way, the resin sheets 30x are arranged to be separated in the plurality of chip mounting regions on the wiring substrate 5 respectively, thereby the first sealing resin materials 30a are formed side by side like the islands. The first sealing resin materials 30a are formed with the octagonal shape to correspond to the shape of the opening portions 24a of the masking tape 24. The reason for forming the first sealing resin material 30a with the octagonal shape is to make it correspond to deformation of a second sealing resin material to be described later.

Note that, instead of attaching the resin sheet 30x, a liquid resin may be coated on the plurality of chip mounting regions on the wiring substrate 5 by a dispenser or the like. In the case that the liquid resin is used, the masking tape 24 does not necessarily need to be attached.

Subsequently, as depicted in FIG. 9, a first semiconductor chip 6 is prepared. The first semiconductor chip 6 is a CPU chip using a silicon substrate, for example.

In the first semiconductor chip 6, through-holes TH are formed in a chip substrate 40 made of silicon and penetrate in the thickness direction thereof. Moreover, an insulating layer 41 is formed on inner faces of the through-holes TH and an upper face and a lower face of the chip substrate 40.

The insulating layer 41 is selected from among a silicon oxide layer ($SiO_2$ layer), a silicon nitride layer (SiN layer), a polyimide layer, or the like. Then, penetrating electrodes 42 made of copper or a copper alloy are filled in one through-holes TH.

Connection electrodes CEx which are formed of a nickel/gold plating layer, a solder layer, or the like are formed on upper ends of the penetrating electrodes 42.

Morever, wiring layers 44 are formed on the lower face of the chip substrate 40 and connected to lower ends of the penetrating electrodes 42. The wiring layers 44 are formed of aluminum, copper, or an alloy of them. Further, a passivation film 45 is formed on the lower face of the chip substrate 40, the passivation film 45 in which opening portions 45a are provided on connection parts of the wiring layers 44.

The passivation film 45 is formed of a silicon oxide layer, a silicon nitride layer, a polyimide resin, or the like.

Post-shaped electrodes PE are provided to stand on the connection parts of the wiring layers 44, and round bump-shaped solder layers 46 are formed at tips of the post-shaped electrodes PE. The post-shaped electrodes PE are made of copper or a copper alloy, for example. The arrangement pitch of the post-shaped electrodes PE of the first semiconductor chip 6 is 80 μm to 100 μm, for example.

In this way, the post-shaped electrodes PE on the lower face side of the first semiconductor chip 6 are electrically connected to the connection electrodes CEx on the upper face side through the wiring layers 44 and the penetrating electrodes 42, thereby the structure is constituted in which the conduction between the upper face side and lower face side is possible.

The lower face side of the first semiconductor chip 6 is formed as an element forming face. In the element forming face, various elements which are not depicted, such as the transistors, the capacitors, the resistors, or the like are formed, and these elements are connected to multi-layer wirings, thereby the electronic circuit is formed.

Then, the electronic circuit in the first semiconductor chip 6 is connected to the post-shaped electrodes PE through the wiring layers 44.

The area of the first sealing resin material 30a in FIG. 7 mentioned above is set larger than the area of the first semiconductor chip 6. For example, the area of the first sealing resin material 30a is about 9 mm×9 mm, and the area of the first semiconductor chip 6 is about 6 mm×6 mm.

Figure 10:
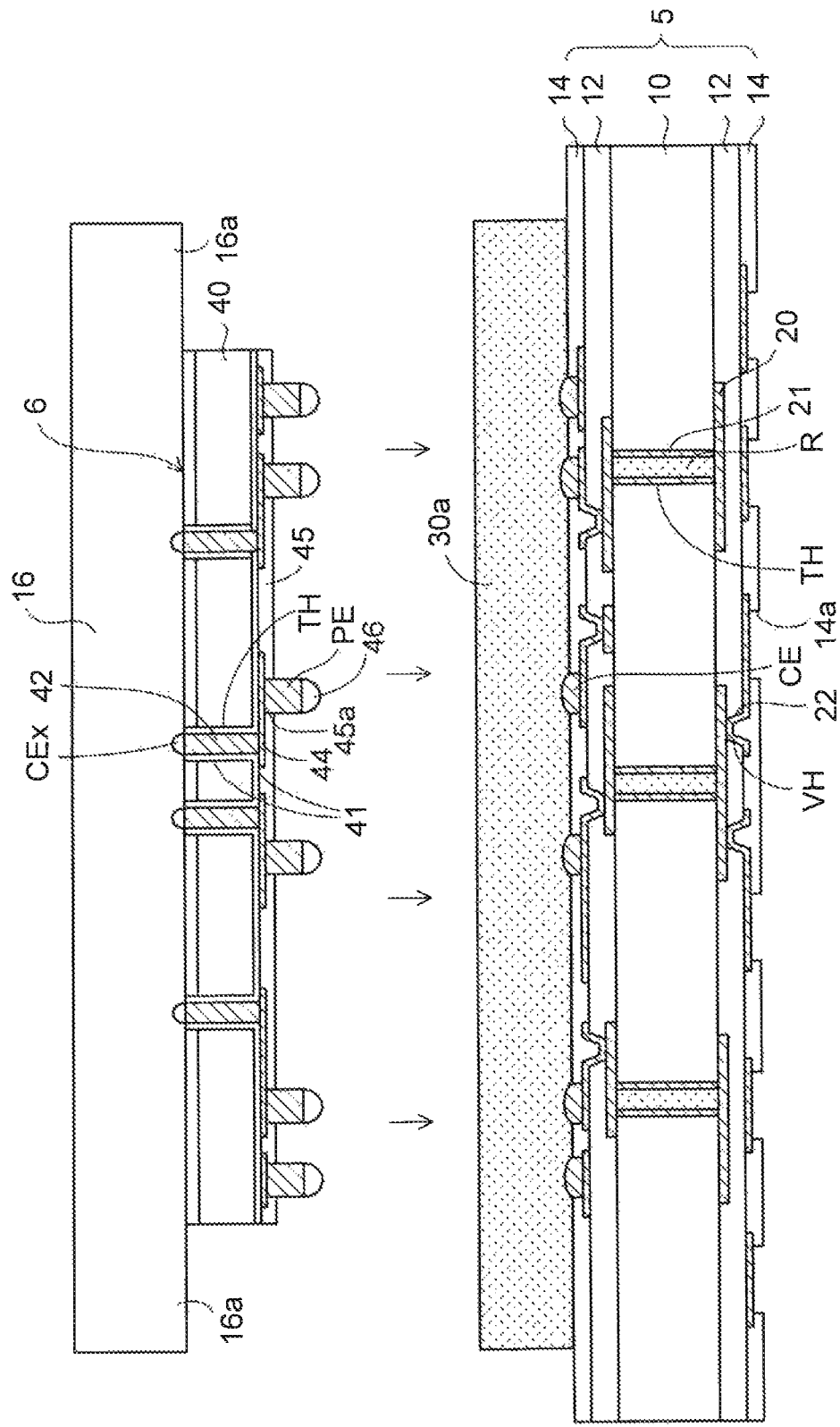
FIG. 10 is a cross-sectional view depicting the Method of manufacturing a semiconductor device of the Embodiment (part 5).

Thereafter, as depicted in FIG. 10, the wiring substrate 5 in FIG. 7 on which the first sealing resin material 30a is formed is arranged on a bonding stage (not depicted), and the wiring substrate 5 is heated up to about 100° C., thus it is in a state that the first sealing resin material 30a is softened.

Then, a back face of the first semiconductor chip 6 in FIG. 9 mentioned above is fixed to a bonding tool 16 by suction. The area of the bonding tool 16 is set larger than the area of the first semiconductor chip 6 and is substantially equal to the area of the first sealing resin material 30a on the wiring substrate 5. For this reason, it is in a state that a periphery portion 16a of the bonding tool 16 protrudes from a side face of the first semiconductor chip 6 toward an outside and is exposed there.

Figure 11:
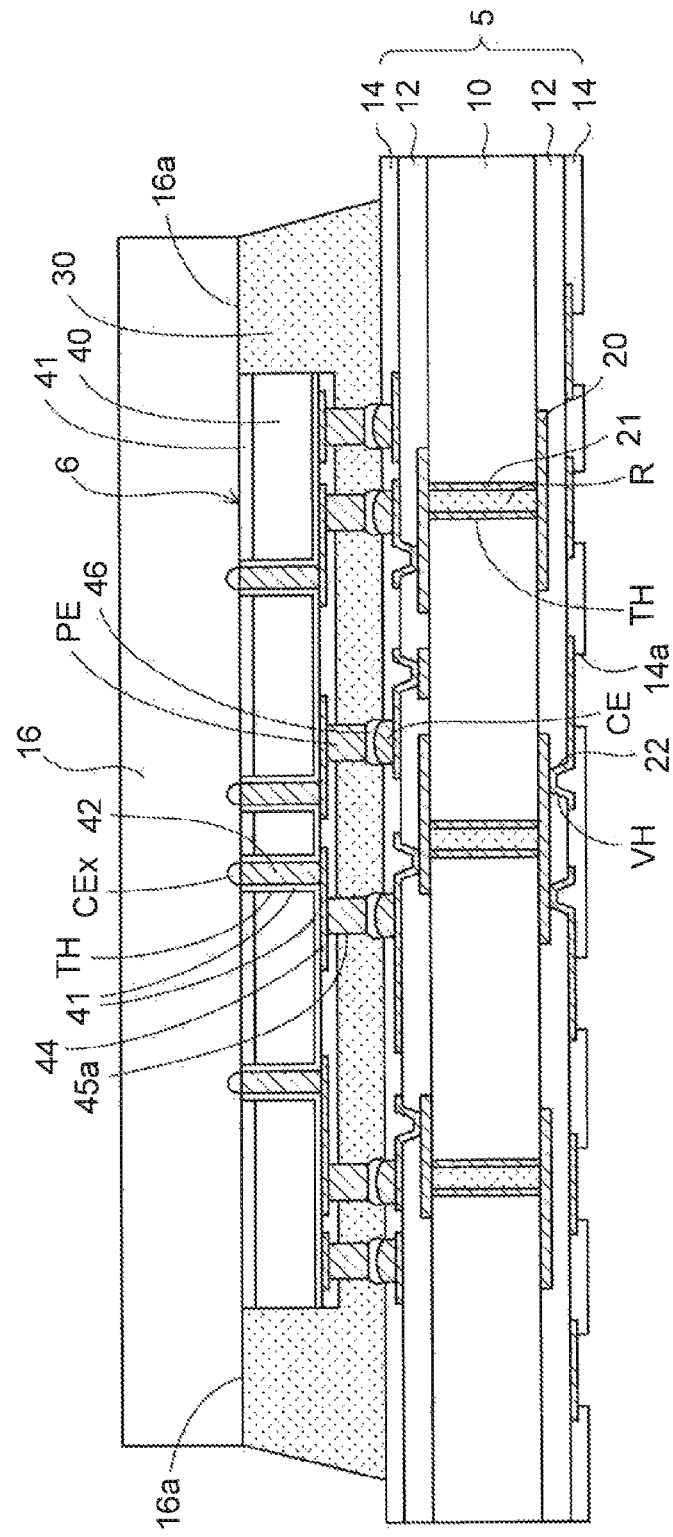
FIG. 11 is a cross-sectional view depicting the Method of manufacturing a semiconductor device of the Embodiment (part 6).

Subsequently, the post-shaped electrodes PE of the first semiconductor chip 6 fixed to the bonding tool 16 by suction are pushed into the first sealing resin material 30a on the wiring substrate 5. By this matter, as depicted in FIG. 11, the post-shaped electrodes PE of the first semiconductor chip 6 are pressure-welded onto the connection electrodes CE of the wiring substrate 5 through the solder layers 46, thus the first semiconductor chip 6 is flip-chip mounted.

Subsequently, reflow heating is performed to melt the solder layers 46, thereby the post-shaped electrodes PE of the first semiconductor chip 6 are bonded to the connection electrodes CE of the wiring substrate 5 by the solder layers 46.

Further, in the case that the first sealing resin material 30*a* is made of an epoxy resin, the first sealing resin material 30*a* is cured by performing a heat process under conditions of a temperature 180° C. and a process time of 1 hour. By this matter, a first underfill resin 30 is filled between the first semiconductor chip 6 and the wiring substrate 5.

At this time, the first sealing resin material 30*a* arranged to the outside of the first semiconductor chip 6 is molded to be pressed by the periphery portion 16*a* of the bonding tool 16. Thereafter, the bonding tool 16 is detached from the first semiconductor chip 6.

Figure 12:
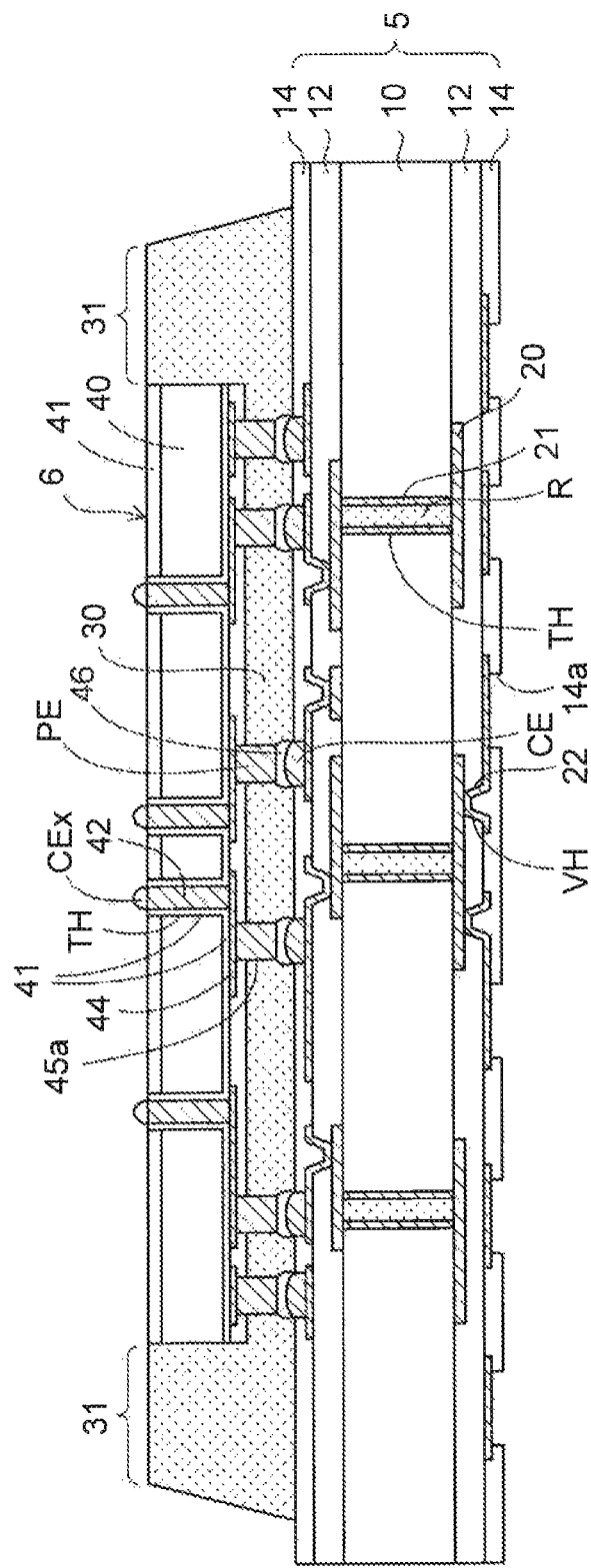
FIG. 12 is a cross-sectional view depicting the Method of manufacturing a semiconductor device of the Embodiment (part 7).

By this matter, as depicted in FIG. 12, an annular pedestal portion 31 in which the first underfill resin 30 between the first semiconductor chip 6 end the wiring substrate 5 is formed to extend to the outside, is formed in a periphery region surrounding the first semiconductor chip 6. Then, an upper face of the pedestal portion 31 of the first underfill resin 30 and an upper face of the first semiconductor chip 6 constitute an identical face.

In this way, the first sealing resin material 30*a* is formed such that a large amount of the resin is arranged in the fillet portion of the first sealing resin material 30*a*, and the fillet portion is molded. By this matter, the pedestal portion 31 of the first underfill resin 30 is arranged in the periphery of the first semiconductor chip 6.

The area of the first underfill realm 30 including the pedestal portion 31 is about 12 mm×12 mm.

Figure 13:
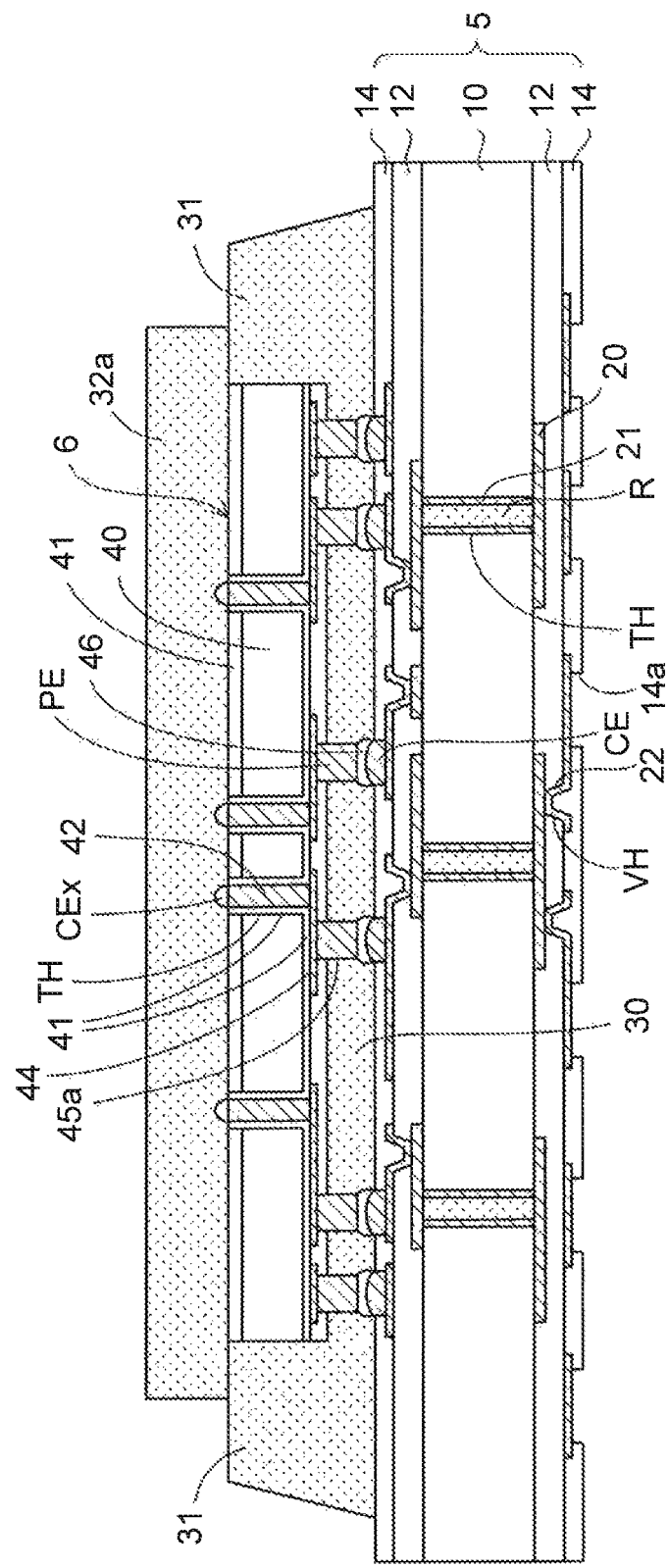
FIG. 13 is a cross-sectional view depicting the Method of manufacturing a semiconductor device of the Embodiment (part 8).

Thereafter, as depicted in FIG. 13, a second sealing resin material 32*a* is formed on the first semiconductor chip 6 in the structure in FIG. 12. The second sealing resin material 32*a* is formed by a method similar to the method of forming the first sealing resin material 30*a* mentioned above.

As one preferred example of the second sealing resin material 32*a*, an epoxy-based resin having a lowest melt viscosity of 10 Pa·s to 90 Pa·s and preferably of 30 Pa·s to 30 Pa·s, or an acryl-based resin having a lowest melt viscosity of 20 Pa·s to 90 Pa·s is used.

In this way, as the second sealing resin material 32*a*, the resin material in which the numerical value of the lowest melt viscosity has two-digits is preferred. In the case of using an epoxy-based resin as the second sealing resin material 32*a*, a resin material that the lowest melt viscosity is lower than the first sealing resin material 30*a* mentioned above is used.

The reason that the resin whose melt viscosity is low is used as the second sealing resin material 32*a* is as follows. As well be described later, when post-shaped electrodes of the second semiconductor chip arrayed at a narrow pitch are pushed with low load into the second sealing resin material 32*a* and are flip-chip connected, it is for preventing that the interposition of the resin and the filler to the connection parts is generated.

Figure 14:
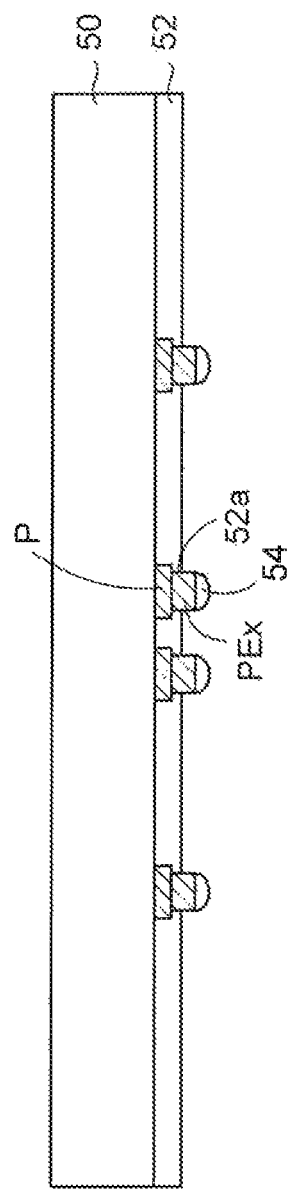
FIG. 14 is a cross-sectional view depicting the Method of manufacturing a semiconductor device of the Embodiment (part 9).

Thereafter, as depicted in FIG. 14, a second semiconductor chip 7 which is to be stacked on the first semiconductor chip 6 is prepared. The second semiconductor chip 7 is a memory chip using a silicon substrate, for example. The area of the second semiconductor chip 7 is set larger than the area of the first semiconductor chip 6. The area of the second sealing resin material 32*a* in FIG. 13 mentioned above is set so as to correspond to the area of the second semiconductor chip 7.

Moreover, the area of the second semiconductor chip 7 is set smaller than the area of the first underfill resin 30 including the pedestal portion 31.

In the second semiconductor chip 7, connection pads P are formed on an element forming face on a lower face side of a chip substrate 50 made of silicon. Like the first semiconductor chip 6, the second semiconductor chip 7 has the electronic circuit formed in the element forming face, and the connection pads P are connected to the electronic circuit.

Moreover, as the outermost layer on the element forming face side, a passivation film 52 in which opening portions 52*a* are arranged on the connection pads P is formed. The passivation film 52 is formed of a silicon oxide layer, a silicon nitride layer, a polyimide resin, or the like.

Further, post-shaped electrodes PEz are connected to the connection pads P and are provided to stand from the passivation film 52 to the outside. Then solder layers 54 are formed at the tips of the post-shaped electrodes PEx. The post-shaped electrodes PEx are formed of copper or a copper alloy, for example.

The arrangement pitch of the post-shaped electrodes PEx of the second semiconductor chip 7 is about 40 μm, for example, and is made narrower than that of the post-shaped electrodes PE of the first semiconductor chip 6.

Figure 15:
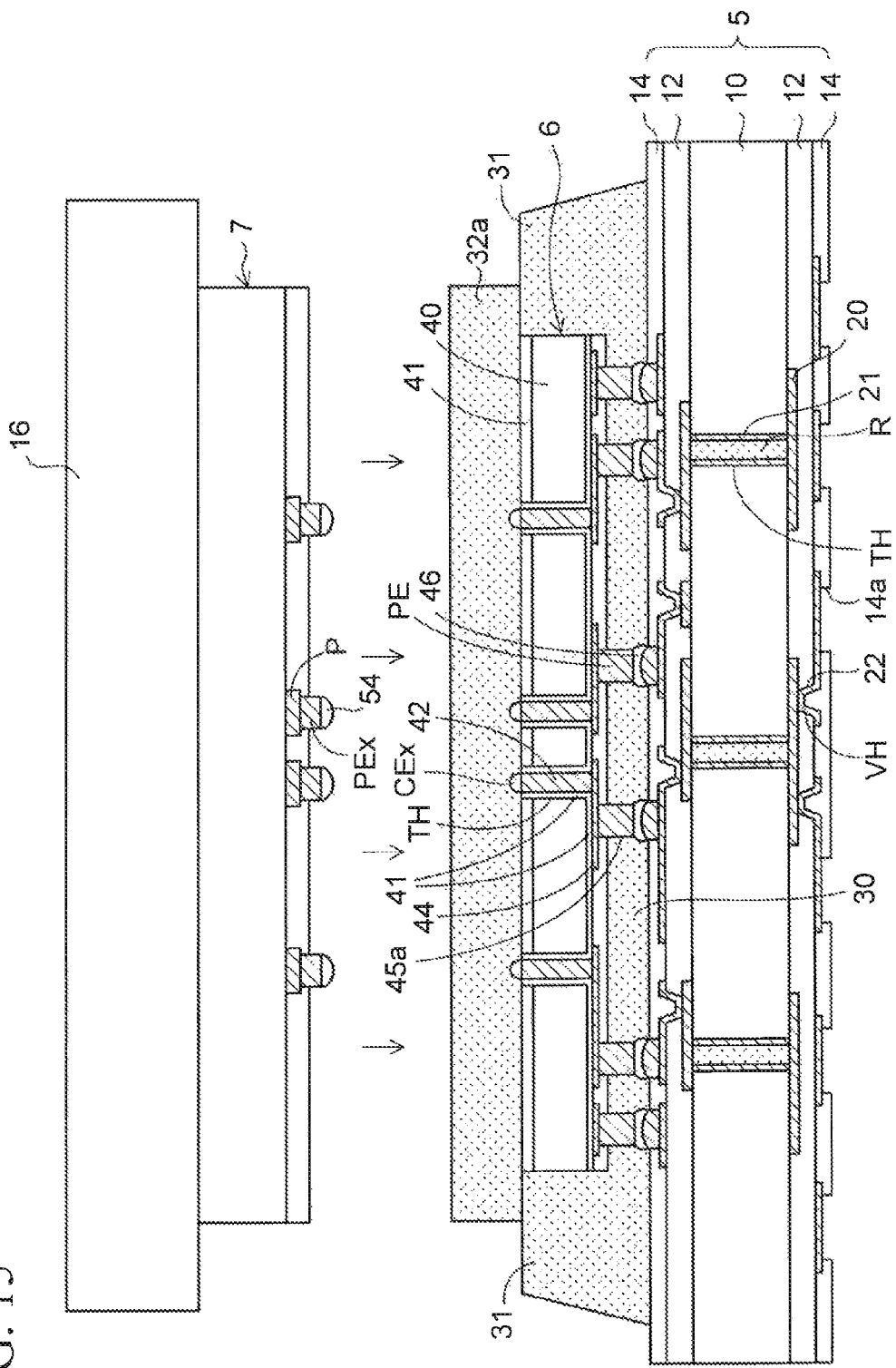
FIG. 15 is a cross-sectional view depicting the Method of manufacturing a semiconductor device of the Embodiment (part 10).

Then, as depicted in FIG. 15, a back face of the second semiconductor chip 7 in FIG. 14 is fixed to the bonding tool 16 by suction. Subsequently, the post-shaped electrodes PEx of the second semiconductor chip 7 fixed to the bonding tool 16 by suction are pushed into the second sealing resin material 32*a* on the first semiconductor chip 6.

Figure 16:
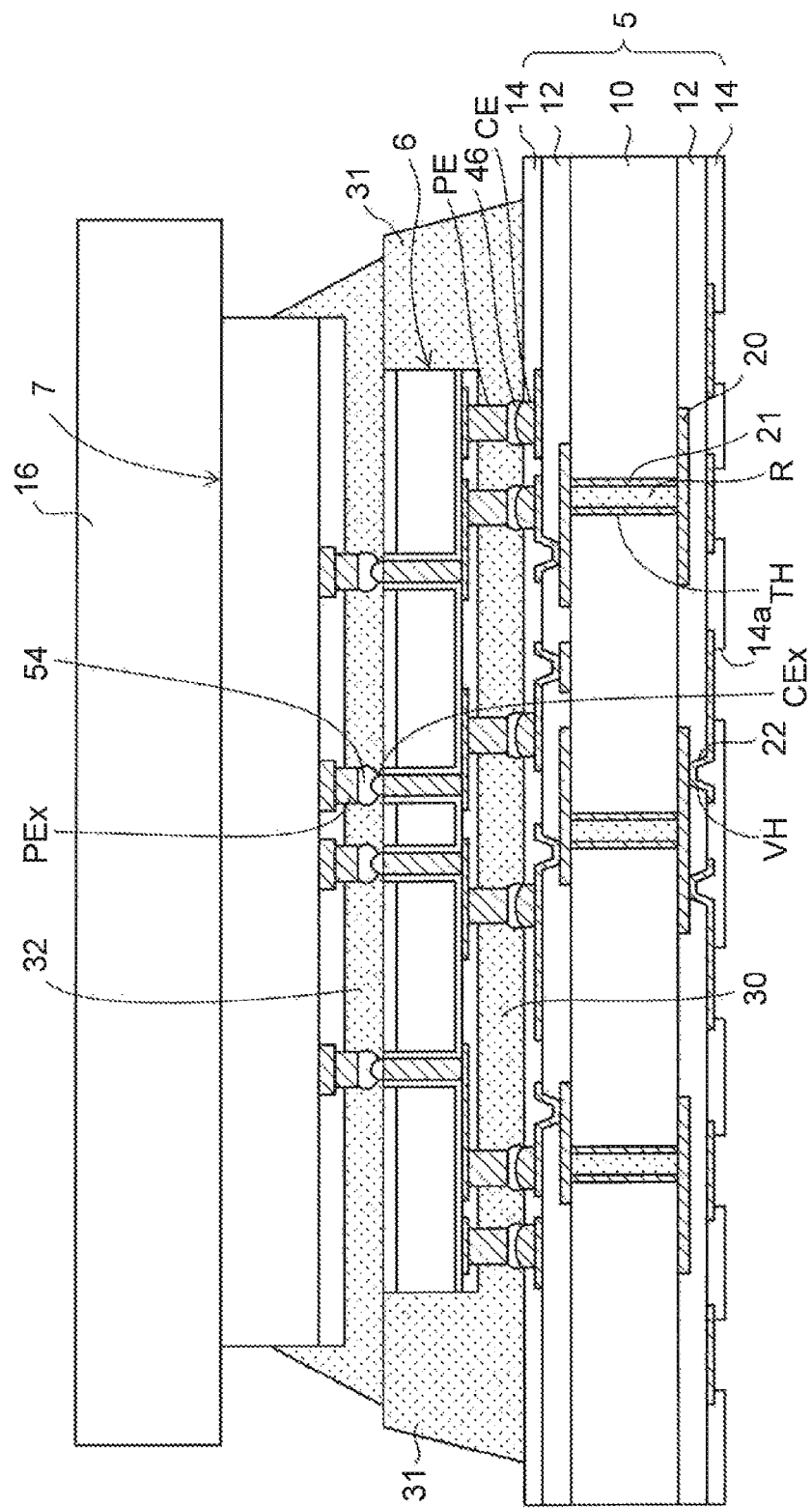
FIG. 16 is a cross-sectional view depicting the Method of manufacturing a semiconductor device of the Embodiment (part 11).

By this matter, as depicted in FIG. 16, the post-shaped electrodes PEx of the second semiconductor chip 7 are pressure-welded onto the connection electrodes CEx of the first semiconductor chip 6 through the solder layers 54, thus the second semiconductor chip 7 is flip-chip mounted.

Subsequently, reflow heating is performed to melt the solder layers 54, thereby the post-shaped electrodes PEx of the second semiconductor chip 7 are bonded to the connection electrodes CEx of the first semiconductor chip 6 by the solder layers 54.

Thereafter, in the case that the second sealing resin material 32*a* is made of the epoxy resin, the second sealing resin material 32*a* is cured by performing a heat process under conditions of a temperature of 165° C. and a process time of 2 hours. By this matter, a second underfill resin 32 is filled between the second semiconductor chip 7 and the first semiconductor chip 6, and between the second semiconductor chip 7 and the first underfill resin 30.

At this time, when the second semiconductor chip 7 is pushed into the second sealing resin material 32*a*, while the second sealing resin material 32*a* flows on the pedestal portion 31 of the first underfill resin 30, the second sealing resin material 32*a* covers a side face of the second semiconductor chip 7.

By this matter, even when the area of the second semiconductor chip 7 is larger than the area of the first semiconductor chip 6, the side face of the second semiconductor chip 7 can be certainly sealed by the second underfill resin 32.

As mentioned above, the arrangement pitch of the post-shaped electrodes PEx of the second semiconductor chip 7 is set significantly narrower than that of the post-shaped electrodes PE of the first semiconductor chip 6, and the distance to the first semiconductor chip 6 is made narrower as well.

In addition, when the second semiconductor chip 7 is flip-chip connected, in order to reduce the damage to the first semiconductor chip 6, it is necessary to lower the load applied to the second semiconductor chip 7.

For this reason, in the case that the melt viscosity of the second sealing resin material 32a is high, there is a fear that the interposition of the resin and the filler is generated between the connection electrodes CEx of the first semiconductor chip 6 and the post-shaped electrodes PEx of the second semiconductor chip 7.

In view of this, the inventor of this application performed tests by dividing to different epoxy resin materials as the second sealing resin material 32a. In the concrete condition, one epoxy resin material has a lowest melt viscosity of 100 Pa·s or more (300 Pa·s), and another epoxy resin material has a lowest melt viscosity lower than 100 Pa·s (50 Pa·s). Then, in both resin materials, a state of the bonding between the connection electrodes CEx of the first semiconductor chip 6 and the post-shaped electrodes PEx of the second semiconductor chip 7 was observed by a scanning electron microscope (SEM).

According to the results, in the epoxy resin material having the high viscosity, in which the lowest melt viscosity is 100 Pa·s or more (300 Pa·s), it was understood that the interposition is generated in which the resin and the filler remained between the solder layers 54 at the tips of the post-shaped electrodes PEx of the second semiconductor chip 7 and the connection electrodes CEx of the first semiconductor chip 6, and the reliability of the electrical connection could not be obtained.

On the other hand, in the epoxy resin material having the low viscosity, in which the lowest melt viscosity is lower than 100 Pa·s (50 Pa·s), it was understood that no resin was confirmed between the solder layers 54 at the tips of the post-shaped electrodes PEx of the second semiconductor chip 7 and the connection electrodes CEx of the first semiconductor chip 6, and the good bonding could be obtained.

As described above, when the second semiconductor chip 7 including the cost-shaped electrodes PEx arrayed at the narrow pitch is flip-chip connected with the prior sealing technique to the first semiconductor chip 6 with the low load, it is confirmed than to use the resin material whose melt viscosity is low is effective.

Moreover, the area of the second semiconductor chip 7 is relatively large. Therefore, when the second semiconductor chip 7 is pushed into the second sealing resin material 32a having the quadrangle shape in a plan view, the center of respective sides of the second sealing resin material 32a is expended outward than the four corners, thus the second sealing resin material 32a is easy to be shaped to a more noticeable octagonal shape.

For this reason, as explained with reference to FIG. 8 mentioned above, the first sealing resin material 30a is formed with the octagonal shape in the plan view such that it can correspond to the deformation of the second sealing resin material 32a.

By this matter, it is prevented that the second underfill resin 32 is formed to flow onto the side face of the first underfill resin 30. If the second underfill resin 32 is formed to flow onto the side face of the first underfill resin 30, the film detachment or the like is generated, thereby the reliability is lowered. Therefore, it is devised such that the second underfill resin 32 does not flow onto the side face of the first underfill resin 30.

Figure 17:
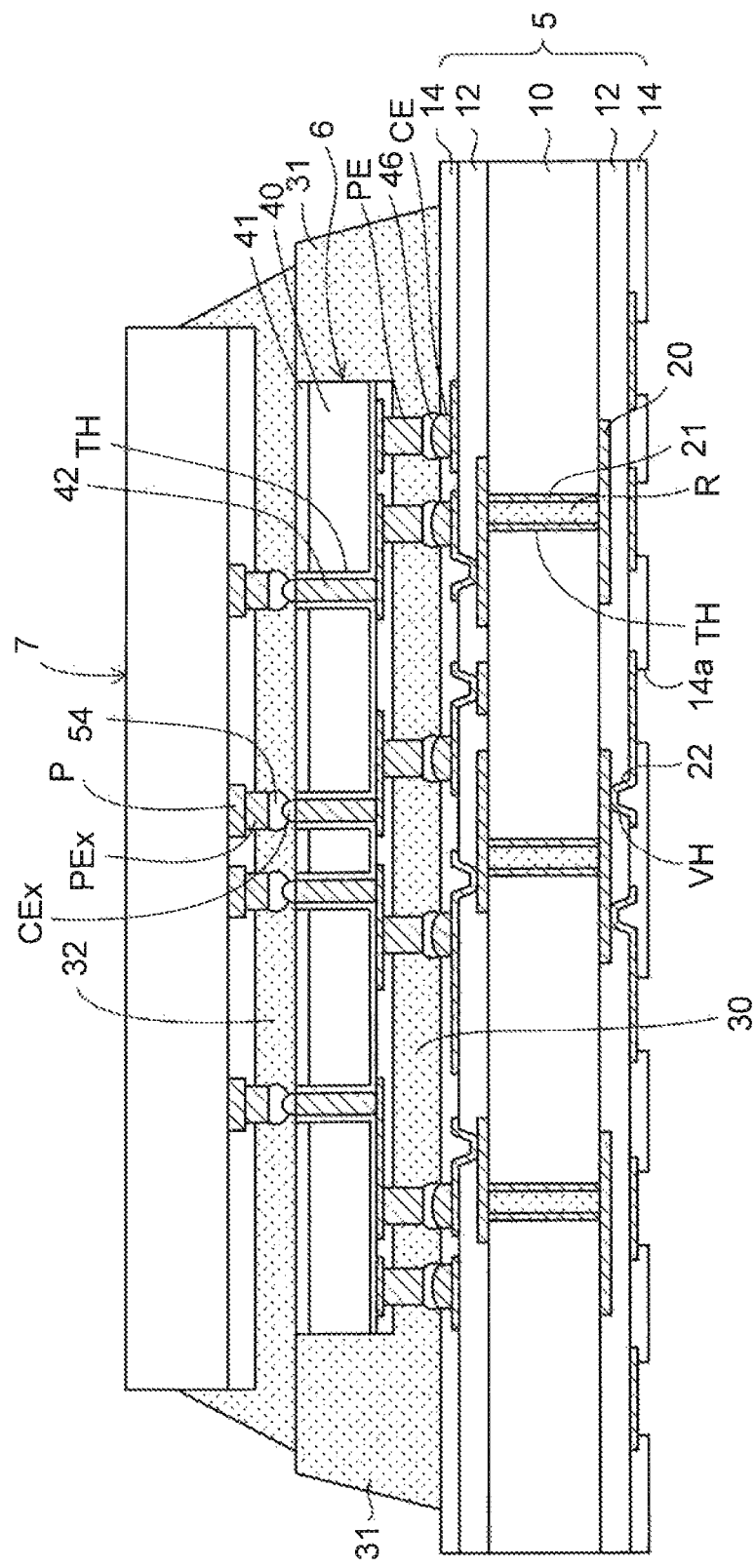
FIG. 17 is a cross-sectional view depicting the method of manufacturing a semiconductor device of the embodiment (part 12).

Thereafter, as depicted in FIG. 17, the bonding tool 16 is detached from the second semiconductor chip 7.

Figure 18:
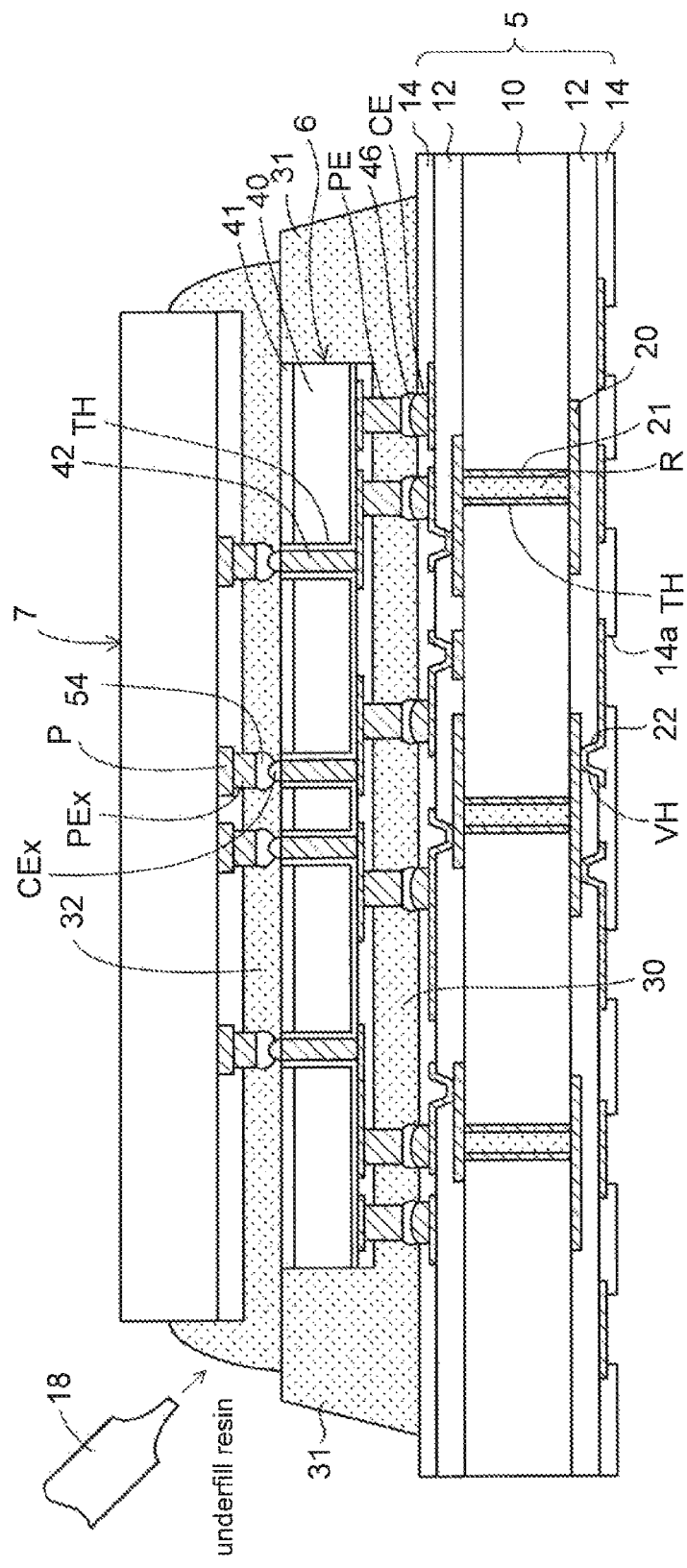
FIG. 18 is a cross-sectional view depicting the method of manufacturing a semiconductor device of the embodiment (part 13).

Alternatively, as depicted in FIG. 18, without using the prior sealing technique mentioned above, the post-shaped electrodes PEx of the second semiconductor chip 7 is flip-chip connected to the connection electrodes CEx of the first semiconductor chip 6, and subsequently, the second underfill resin 32 may be filled in a space between the first semiconductor chip 6 and the second semiconductor chip 7.

In this case, the resin can be coated on the pedestal portion 31 of the first underfill resin 30 from a dispenser 18. Therefore, similarly to FIG. 17, the side face of the second semiconductor chip 7 can be certainly sealed by the second underfill resin 32.

Thereafter, as depicted in FIG. 19, a mold resin 34 in which epoxy resin is used as one example is formed on the wiring substrate 5 and the second semiconductor chip 7, thereby the structure from side faces of the first and second underfill resins 30 and 32 to an upper face of the second semiconductor chip 7 is sealed by the mold resin 34.

Note that, in the case that the first and second semiconductor chips 6 and 7 are sufficiently protected by the first and second underfill resins 30 and 32, the mold resin 34 may be omitted.

Further, solder balls are mounted on the connection parts of the second wiring layers 22 on the lower face side of the wiring substrate 5, or the like, thus external connection terminals T are formed. Then, the wiring substrate 5 is cut such that each chip mounting region in which the first semiconductor chip 6 and the second semiconductor chip 7 are stacked can be obtained.

By the above step, a semiconductor device 1 of the embodiment is manufactured.

As depicted in FIG. 19, in the semiconductor device 1 of the embodiment, the post-shaped electrodes PE of the first semiconductor chip 6 in FIG. 9 mentioned above are flip-chip connected to the connection electrodes CE on the upper face side of the wiring substrate 5 in FIG. 6 mentioned above through the solder layers 46.

The first underfill resin 30 is filled between the first semiconductor chip 6 and the wiring substrate 5. The first underfill resin 30 is formed to include the annular pedestal portion 31 which extends from a region between the first semiconductor chip 6 and the wiring substrate 5 to a region in the periphery of the first semiconductor chip 6.

Further, the post-shaped electrodes PEx of the second semiconductor chip 7 in FIG. 14 mentioned above ere flip-chip connected to the connection electrodes CEx on the upper face side of the first semiconductor chip 6 through the solder layers 54. Moreover, the second underfill resin 32 is filled between the first semiconductor chip 6 and the second semiconductor chip 7.

The second underfill resin 32 extends from a region between the first semiconductor chip 6 and the second semiconductor chip 7 to the upper side of the pedestal portion 31 of the first underfill resin 30 and seals the side face of the second semiconductor chip 7.

It suffices that at least the side face of the element forming region on the lower face side of the second semiconductor chip 7 is sealed by the second underfill resin 32. The side face near the back face side of the second semiconductor chip 7 may be exposed.

The area of the second semiconductor chip 7 is set larger than the area of the first semiconductor chip 6. However, the pedestal portion 31 of the first underfill resin 30 is arranged in the periphery of the first semiconductor chip 6, and the side face of the second semiconductor chip 7 is arranged in a region between the side face of the first semiconductor chip 6 and the side face of the pedestal portion 31 of the first underfill resin 30.

For this reason, the side face of the second semiconductor chip 7 can be certainly sealed by the second underfill resin 32 formed from the second sealing resin material 32a arranged on the pedestal portion 31.

Alternatively, the pedestal portion 31 of the first underfill resin 30 may be extended farther outward and the second sealing resin material 32a may be made thicker. By this matter, the whole of the side face of the second semiconductor chip 7 can be sealed by the second underfill resin 32 as well.

As described above, in the semiconductor device 1 of this embodiment, the pedestal portion 31 of the first underfill resin 30 is arranged in the periphery of the first semiconductor chip 6. For this reason, even when the second semiconductor chip 7 larger in area than the first semiconductor chip 6 is flip-chip connected on the first semiconductor chip 6, the second underfill resin 32 can be arranged on the pedestal portion 31 of the first underfill resin 30.

By this matter, the side face of the second semiconductor chip 7 arranged outward from the side face of the first semiconductor chip 6 can be sealed by the second underfill resin 32.

As a result, the side face of the element forming region of the second semiconductor chip 7 can be certainly sealed by the second underfill resin 32a. Therefore, the entering of the moisture into the electronic circuit of the second semiconductor chip 7 is prevented, thus the generation of the problems such as characteristic deterioration and failure can be prevented.

FIG. 20 depicts a semiconductor device 1a of a modification of the embodiment. In the semiconductor device 1a of the modification in FIG. 20, the mold resin 34 is formed in the periphery of the first and second underfill resins 30 and 32 and the second semiconductor chip 7 such that the back face (upper face) of the second semiconductor chip 7 in FIG. 17 mentioned above is exposed.

Further, a heat radiation member 60 is bonded to the upper face of the second semiconductor chip 7 and an upper face of the mold resin 34 through a bonding layer 36. As the bonding layer 36, an adhesive agent made of a resin having excellent thermal conductivity such as called TIM (Thermal Interface Material) is used.

By this matter, the heat radiation member 60 is connected to the back face of the second semiconductor chip 7, thereby a semiconductor device having good heat radiation performance is constituted. As the heat radiation member 60, a heat spreader made of copper, aluminum or the like, a heat sink including heat radiation fins, a heat pipe, or the like can be used.

Other Embodiments

In the embodiment described above, the first semiconductor chip 6 and the second semiconductor chip 7 are flip-chip connected to the wiring substrate 5 in this order and are stacked. Besides this method, a semiconductor chip may be employed instead of the wiring substrate 5, and a similar constitution may be made by stacking the three semiconductor chips.

Alternatively, another wiring substrate such as a silicon interposer, or the like may be employed instead of the first semiconductor chip 6, and a similar constitution may be made by stacking the other wiring substrate and the semiconductor chip onto the wiring substrate.

Further alternatively, wiring substrates of various types may be employed instead of the first semiconductor chip 6 and the second semiconductor chip 7, and a similar constitution may be made by stacking the three wiring substrates.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
    a wiring substrate;
    a first semiconductor chip flip-chip connected on the wiring substrate;
    a first underfill resin filled between the wiring substrate and the first semiconductor chip, the first underfill resin including a pedestal portion arranged in a periphery of the first semiconductor chip,
    wherein an upper face of the pedestal portion of the first underfill resin and an upper face of the first semiconductor chip are flush, and are arranged at the same height position, and the pedestal portion of the first underfill resin covers a whole of a side face of the first semiconductor chip, and an upper face of the pedestal portion of the first underfill resin is a horizontal plane;
    a second semiconductor chip flip-chip connected on the first semiconductor chip, and being larger in area than the first semiconductor chip; and
    a second underfill resin filled between the first semiconductor chip and the second semiconductor chip, the second underfill resin covering the horizontal plane of the pedestal portion of the first underfill resin and a side face of the second semiconductor chip,
    wherein the side face of the second semiconductor chip is positioned at a middle position between the side face of the first semiconductor chip and a side face of the pedestal portion of the first underfill resin, and the middle position is positioned inwardly away from a periphery of the upper face of the pedestal portion, and
    an upper end of a side face of the second underfill resin contacts the side face of the second semiconductor chip, and a lower end of a side face of the second underfill resin contacts an upper face of the pedestal portion between the side face of the second semiconductor chip and the side face of the pedestal portion, and the lower end is away from the side face of the first semiconductor chip.

2. The semiconductor device according to claim 1, wherein the first semiconductor chip has a penetrating electrode, and an electrode of the second semiconductor chip is connected to an upper end of the penetrating electrode.

3. The semiconductor device according to claim 1, wherein an insulating layer is formed on an upper face of a substrate of the first semiconductor chip, and a penetrating electrode is formed to penetrate the substrate and the insulating layer in a thickness direction, and an electrode of the second semiconductor chip is connected to an upper end of the penetrating electrode.

4. The semiconductor device according to claim 1, further comprising a mold resin sealing the first semiconductor chip, the second semiconductor chip, the first underfill resin and the second underfill resin.

5. The semiconductor device according to claim 1, further comprising a heat radiation member formed on an upper face of the second semiconductor chip.

6. The semiconductor device according to claim 1, wherein, a side face of a part of the second underfill resin located on the horizontal plane of the pedestal portion of the first underfill resin is inclined from a side face of the second semiconductor chip toward an outside.

7. A method of manufacturing a semiconductor device, comprising:
   forming a first sealing resin material on a wiring substrate;
   pushing an electrode of a first semiconductor chip into the first sealing resin material to flip-chip connect the first semiconductor chip to the wiring substrate, and filling a first underfill resin between the wiring substrate and the first semiconductor chip, and forming a pedestal portion from the first underfill resin in a periphery of the first semiconductor chip wherein, an upper face of the pedestal portion of the first underfill resin and an upper face of the first semiconductor chip are flush, and are arranged at the same height position, and the pedestal portion of the first underfill resign covers a whole of a side face of the first semiconductor chip, and an upper face of the pedestal portion of the first underfill resin is made to a horizontal plane;
   forming a second sealing resin material on the first semiconductor chip; and
   pushing an electrode of a second semiconductor chip into the second sealing resin material to flip-chip connect the second semiconductor chip to the first semiconductor chip, and filling a second underfill resin between the first semiconductor chip and the second semiconductor chip, and covering the horizontal plane of the pedestal portion of the first underfill resin and a side face of the second semiconductor chip with the second underfill resin,
   wherein the side face of the second semiconductor chip is positioned at a middle position between the side face of the first semiconductor chip and a side face of the pedestal portion of the first underfill resin, and the middle position is positioned inwardly away from a periphery of the upper face of the pedestal portion, and
   an upper end of a side face of the second underfill resin contacts the side face of the second semiconductor chip, and a lower end of a side face of the second underfill resin contacts an upper face of the pedestal portion between the side face of the second semiconductor chip and the side face of the pedestal portion, and the lower end is away from the side face of the first semiconductor chip.

8. The method of manufacturing a semiconductor device according to claim 7, wherein, in the filling of the first underfill resin,
   the first semiconductor chip is pushed into the first sealing resin material in a state that the first semiconductor chip is fixed to a bonding tool larger in area than the first semiconductor chip, and
   a periphery part of the first sealing resin material is pressed by a lower face of a periphery part of the bonding tool, thus the pedestal portion is formed.

9. The method of manufacturing a semiconductor device according to claim 7, wherein the second underfill resin is formed of a resin material whose melt viscosity is lower than the first underfill resin.

10. The method of manufacturing a semiconductor device according to claim 7, wherein the first semiconductor chip has a penetrating electrode, and the electrode of the second semiconductor chip is connected to an upper end of the penetrating electrode.

11. The method of manufacturing a semiconductor device according to claim 7, wherein an insulating layer is formed on an upper face of a substrate of the first semiconductor chip, and a penetrating electrode is formed to penetrate the substrate and the insulating layer in a thickness direction, and the electrode of the second semiconductor chip is connected to an upper end of the penetrating electrode.

12. The method of manufacturing a semiconductor device according to claim 7, wherein after the filling the second underfill resin, further comprising a mold resin sealing the first semiconductor chip, the second semiconductor chip, the first underfill resin and the second underfill resin.

13. The method of manufacturing a semiconductor device according to claim 7, wherein after the filling a second underfill resin, further comprising forming a heat radiation member on an upper face of the second semiconductor chip.

14. A method of manufacturing a semiconductor device, comprising:
   forming a sealing resin material on a wiring substrate;
   pushing an electrode of a first semiconductor chip into the sealing resin material to flip-chip connect the first semiconductor chip to the wiring substrate, and filling a first underfill resin between the wiring substrate and the first semiconductor chip, and forming a pedestal portion from the first underfill resin in a periphery of the first semiconductor chip, wherein an upper face of the pedestal portion of the first underfill resin and an upper face of the first semiconductor chip are flush, and are arranged at the same height position, and the pedestal portion of the first underfill resin covers a whole of a side face of the first semiconductor chip, and an upper face of the pedestal portion of the first underfill resin is made to a horizontal plane;
   flip-chip connecting a second semiconductor chip to the first semiconductor chip; and
   filling a second underfill resin between the first semiconductor chip and the second semiconductor chip, and covering the horizontal plane of the pedestal portion of the first underfill resin and a side face of the second semiconductor chip with the second underfill resin,
   wherein the side face of the second semiconductor chip is positioned at a middle position between the side face of the first semiconductor chip and a side face of the pedestal portion of the first underfill resin, and the middle position is positioned inwardly away from a periphery of the upper face of the pedestal portion, and
   an upper end of a side face of the second underfill resin contacts the side face of the second semiconductor chip, and a lower end of a side face of the second underfill resin contacts an upper face of the pedestal portion between the side face of the second semiconductor chip and the side face of the pedestal portion, and the lower end is away from the side face of the first semiconductor chip.

15. The method of manufacturing a semiconductor device according to claim 14, wherein the first semiconductor chip has a penetrating electrode, and the electrode of the second semiconductor chip is connected to an upper end of the penetrating electrode.

16. The method of manufacturing a semiconductor device according to claim 14, wherein an insulating layer is formed on an upper face of a substrate of the first semiconductor chip, and a penetrating electrode is formed to penetrate the substrate and the insulating layer in a thickness direction, and the electrode of the second semiconductor chip is connected to an upper end of the penetrating electrode.

17. The method of manufacturing a semiconductor device according to claim 14, wherein after the filling the second underfill resin, further comprising forming a mold resin sealing the first semiconductor chip, the second semiconductor chip, the first underfill resin and the second underfill resin.

18. The method of manufacturing a semiconductor device according to claim 14, wherein after the filling a second underfill resin, further comprising forming a heat radiation member on an upper face of the second semiconductor chip.

19. The method of manufacturing a semiconductor device according to claim 14, wherein, in the filling of the first underfill resin,
the first semiconductor chip is pushed into the first sealing resin material in a state that the first semiconductor chip is fixed to a bonding tool larger in area than the first semiconductor chip, and
a periphery part of the first sealing resin material is pressed by a lower face of a periphery part of the bonding tool, thus the pedestal portion is formed.

20. The method of manufacturing a semiconductor device according to claim 14, wherein the second underfill resin is formed of a resin material whose melt viscosity is lower than the first underfill resin.

* * * * *